United States Patent [19]
Owen et al.

[11] Patent Number: 5,426,303
[45] Date of Patent: Jun. 20, 1995

[54] THERMAL ISOLATION STRUCTURE FOR HYBRID THERMAL DETECTORS

[75] Inventors: Robert A. Owen, Rowlett; John P. Long, Garland; Bert T. Runnels, Garland; Gail D. Shelton, Mesquite; William K. Walker, Plano, all of Tex.

[73] Assignee: Texas Instruments Incorporated, Dallas, Tex.

[21] Appl. No.: 235,068

[22] Filed: Apr. 29, 1994

[51] Int. Cl.⁶ .................................... H04N 5/33
[52] U.S. Cl. .............................. 250/332; 250/338.3
[58] Field of Search ............... 250/332, 338.3, 349, 250/352

[56] References Cited
U.S. PATENT DOCUMENTS

| | | | |
|---|---|---|---|
| 3,846,820 | 11/1974 | Lampe et al. | 250/332 |
| 4,018,608 | 4/1977 | Frazier | 96/27 |
| 4,080,532 | 3/1978 | Hopper | 250/332 |
| 4,142,207 | 2/1979 | McCormack et al. | 250/332 |
| 4,143,269 | 3/1979 | McCormack et al. | 250/352 |
| 4,162,402 | 7/1979 | Hopper | 250/332 |
| 4,205,227 | 5/1980 | Reed | 250/330 |
| 4,275,302 | 6/1981 | Imbert et al. | 250/330 |
| 4,379,232 | 4/1983 | Hopper | 250/332 |
| 4,594,507 | 6/1986 | Elliott et al. | 250/331 |
| 4,705,361 | 11/1987 | Frazier et al. | 350/355 |
| 4,740,700 | 4/1988 | Shaham et al. | 250/332 |
| 4,751,387 | 6/1988 | Robillard | 250/331 |
| 4,994,672 | 2/1991 | Cross et al. | 250/330 |
| 5,010,251 | 4/1991 | Grinberg et al. | 250/332 |
| 5,021,663 | 6/1991 | Hornbeck | 250/349 |
| 5,047,644 | 9/1991 | Meissner et al. | 250/332 |
| 5,051,591 | 9/1991 | Trotta et al. | 250/351 |
| 5,196,703 | 3/1993 | Keenan | 350/232 |
| 5,238,530 | 8/1993 | Douglas et al. | 156/635 |
| 5,264,326 | 11/1993 | Meissner et al. | 430/313 |

FOREIGN PATENT DOCUMENTS

| | | |
|---|---|---|
| 939943 | 1/1974 | Canada . |
| 2111746 | 2/1971 | Germany . |
| 197806 | 6/1976 | Germany . |
| 2251952 | 7/1992 | United Kingdom . |
| WO9116607 | 10/1991 | WIPO . |

OTHER PUBLICATIONS

R. A. Wood, "HIDAD-A Monolithic, Silicon, Uncooled Infrared Imaging Focal Plane Array," HIDAD, date unknown, pp. 579-581.

Primary Examiner—Carolyn E. Fields
Attorney, Agent, or Firm—Brian A. Carlson; James C. Kesterson; Richard L. Donaldson

[57] ABSTRACT

A thermal detection system (10, 110, 210) includes a focal plane array (20, 120, 220), a thermal isolation structure (40, 140, 240), and an integrated circuit substrate (60, 160, 260). The focal plane array (20, 120, 220) includes a plurality of thermal sensors (30, 130, 230). The thermal isolation structure (40, 140, 240) includes mesa-type formations (44, 146, 148, 244) and bridge structures (42, 142, 144, 242) that provide thermal isolation, signal transport, and structural support of the focal plane array (20, 120, 220) when mounted on the integrated circuit substrate (60, 160, 260). Thermal detection system (10) includes an infrared absorber and common electrode assembly (22) which provides a bias voltage to all thermal sensors (30). Thermal detection system (110) has a plurality of electrically isolated thermal sensors (130), each thermal sensor (130) is supported by bridge structures (142, 144), which provide a bias voltage to and receive a signal voltage from the thermal sensor (130). Thermal detection system (220) has a plurality of electrically isolated thermal sensors (230), each thermal sensor (230) is electrically coupled to a pair of leads (246, 247), which are supported by a reinforcing layer (245). Bridge structures (42, 142, 144, 242) may be formed from a low thermal conductivity and adequate electrical conductivity material, such as silicon monoxide and chromium or other selected cermets.

20 Claims, 3 Drawing Sheets

THERMAL ISOLATION STRUCTURE FOR HYBRID THERMAL DETECTORS

RELATED APPLICATIONS

This application is related to copending application Ser. No. 08/182,865, entitled *Infrared Detector and Method*, copending application Ser. No. 08/182,268, entitled *Infrared Detector and Method*, and copending application Ser. No. 08/235835, entitled *Inter-Pixel Thermal Isolation for Hybrid Thermal Detectors*, all applications of the same assignee.

TECHNICAL FIELD OF THE INVENTION

This invention relates to a thermal isolation structure for hybrid solid state systems, and more particularly to thermal detection systems and method of fabrication.

BACKGROUND OF THE INVENTION

One common application for thermal sensors is in thermal (infrared) detection devices such as night vision equipment. One such class of thermal detection devices includes a focal plane array of infrared detector elements or thermal sensors coupled to an integrated circuit substrate with a corresponding plurality of contact pads between the focal plane array and the integrated circuit substrate. The thermal sensors define the respective picture elements or pixels of the resulting thermal image.

One type of thermal sensor includes a pyroelectric element formed from a pyroelectric material that exhibits a state of electrical polarization dependent upon temperature changes in response to thermal radiation. Barium strontium titanate (BST) is one example of such pyroelectric material. In one embodiment, an infrared absorber and common electrode assembly are disposed on one side of the pyroelectric elements. A sensor signal electrode is disposed on the opposite of each pyroelectric element. The infrared absorber and common electrode assembly extends across the surface of the focal plane array and is coupled to each of the pyroelectric elements. Each pyroelectric element has its own separate sensor signal electrode. Each infrared detector element or thermal sensor is defined, in part, by the infrared absorber and common electrode assembly and a respective sensor signal electrode, which constitute capacitive plates, and a respective pyroelectric element, which constitutes a dielectric disposed between the capacitive plates.

To maximize thermal response and enhance thermal image accuracy, each pyroelectric element of the focal plane array is preferably isolated thermally from the associated integrated circuit substrate to insure that the sensor signal from each thermal sensor accurately represents incident infrared radiation. Thermal isolation structures are typically disposed between the focal plane array and the integrated circuit substrate to provide both mechanical support and a sensor signal flowpath, while minimizing thermal coupling between the thermal sensors and the integrated circuit substrate. Several approaches have been used to provide a thermal isolation structure between a plurality of thermal sensors and an underlying integrated circuit substrate.

SUMMARY OF THE INVENTION

In accordance with the present invention, the disadvantages and problems associated with previous thermal isolation structures used to couple, both mechanically and electrically, component structures of a hybrid thermal detection system have been substantially reduced or eliminated. The present invention provides enhanced thermal isolation through a plurality of bridge structures formed between the focal plane array and the integrated circuit substrate.

In one aspect of the present invention, a hybrid thermal detector includes a focal plane array mounted with a thermal isolation structure on an integrated circuit substrate. A plurality of thermal sensors provide a sensor signal output representative of the thermal radiation incident to the focal plane array. A plurality of signal contact pads, disposed on the integrated circuit substrate, receive the sensor signal output from the respective thermal sensors. The thermal isolation structure, formed in part by a plurality of bridge structures, projects from the integrated circuit substrate adjacent to each signal contact pad. The bridge structures are formed from a single film of low thermal conductivity material and provide support for mounting the focal plane array on the integrated circuit substrate and provide a sensor signal output path to the signal contact pads.

In accordance with another aspect of the present invention, a method of fabricating a hybrid thermal detection system includes forming a focal plane array from a plurality of thermal sensors which provide a sensor signal output representative of thermal radiation incident to the focal plane array. The method of fabrication provides an integrated circuit substrate with a plurality of signal contact pads for receiving the sensor signal output from the respective thermal sensors. A plurality of mesa-type formations are formed to project from the integrated circuit substrate adjacent to the signal contact pads. A plurality of bridge structures are formed from a single film of low thermal conductivity and adequate electrical conductivity material. Each bridge structure has a corresponding signal contact pad. The method of fabrication includes mounting the focal plane array with the bridge structures on the integrated circuit substrate.

One aspect of the present invention can improve thermal isolation between component structures of a hybrid thermal detection system by providing a relatively robust supporting structure that also serves as an electric coupling between the focal plane array and the integrated circuit substrate. The bridge structures are preferably formed of nonmetallic, low thermal conductivity material that offers high strength and adequate electrical conductance, while minimizing thermal coupling between the focal plane array and the integrated circuit substrate. In one embodiment, the bridge structure may be formed from a single film of low thermal conductivity cermet or other selected materials.

Important technical advantages of the present invention can include minimizing thermal conductance while improving overall structural strength. A bridge structure formed from low thermal conductivity material provides more strength than a structure offering comparable thermal isolation formed of an electrically nonconductive film supporting an extremely thin electrically conductive film. Furthermore, a bridge structure formed of low thermal conductivity material provides adequate electrical coupling for the sensor signal flowpath between the focal plane array and the integrated circuit substrate.

Other important technical advantages of the present invention can include that the compromise between structure and thermal conductance of the thermal isolation structure is easier to optimize using low thermal conductivity materials, especially in a single film approach. For example, by using a single film of low thermal conductivity material the thermal isolation structure can be easily optimized to provide maximum thermal isolation and maximum structural support given a minimum required electrical conductivity for the sensor signal flowpath.

Further important technical advantages of the present invention can include a less complex and intricate thermal isolation fabrication process. In previous systems using an electrically non-conductive film supporting an extremely thin electrically conductive film, fabrication tolerances were pushing a design limit in order to maximize thermal isolation. By using more robust and larger bridge structures formed from low thermal conductivity material, the present invention achieves the same levels of thermal isolation without an overly complex and intricate fabrication process.

Still further important technical advantages of the present invention can include that a low thermal conductivity material, such as silicon monoxide and chromium and other selected cermets, serves the multiple functions of thermal isolation, structural support, and signal transport. A bridge structure formed from a single film of low thermal conductivity material thermally isolates the focal plane array from the integrated circuit substrate, supports the mounting of the focal plane array over the integrated circuit substrate, and provides a sensor signal flowpath.

BRIEF DESCRIPTION OF THE DRAWINGS

For a more complete understanding of the present invention, and for further features and advantages, reference is now made to the following description, taken in conjunction with the accompanying drawings, in which.

DETAILED DESCRIPTION OF THE INVENTION

Figure 1:
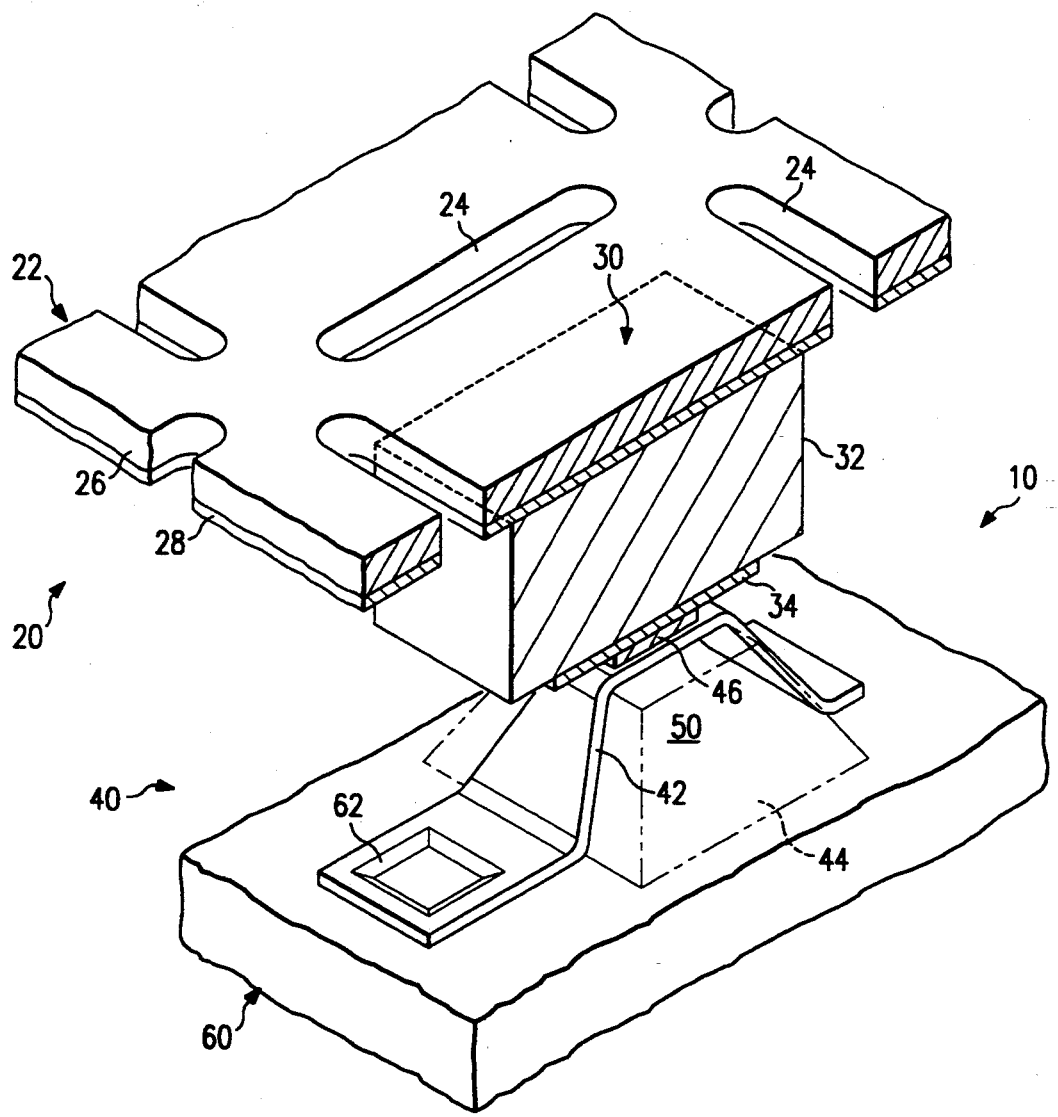
FIG. 1 is an isometric drawing with portions broken away showing a thermal isolation structure having a mesa-type formation with sloped sidewalls, shown in shadow lines, and a bridge structure for providing thermal isolation, structural support, and electrical coupling of a thermal sensor to an associated contact pad on an integrated circuit substrate.
Figure 2:
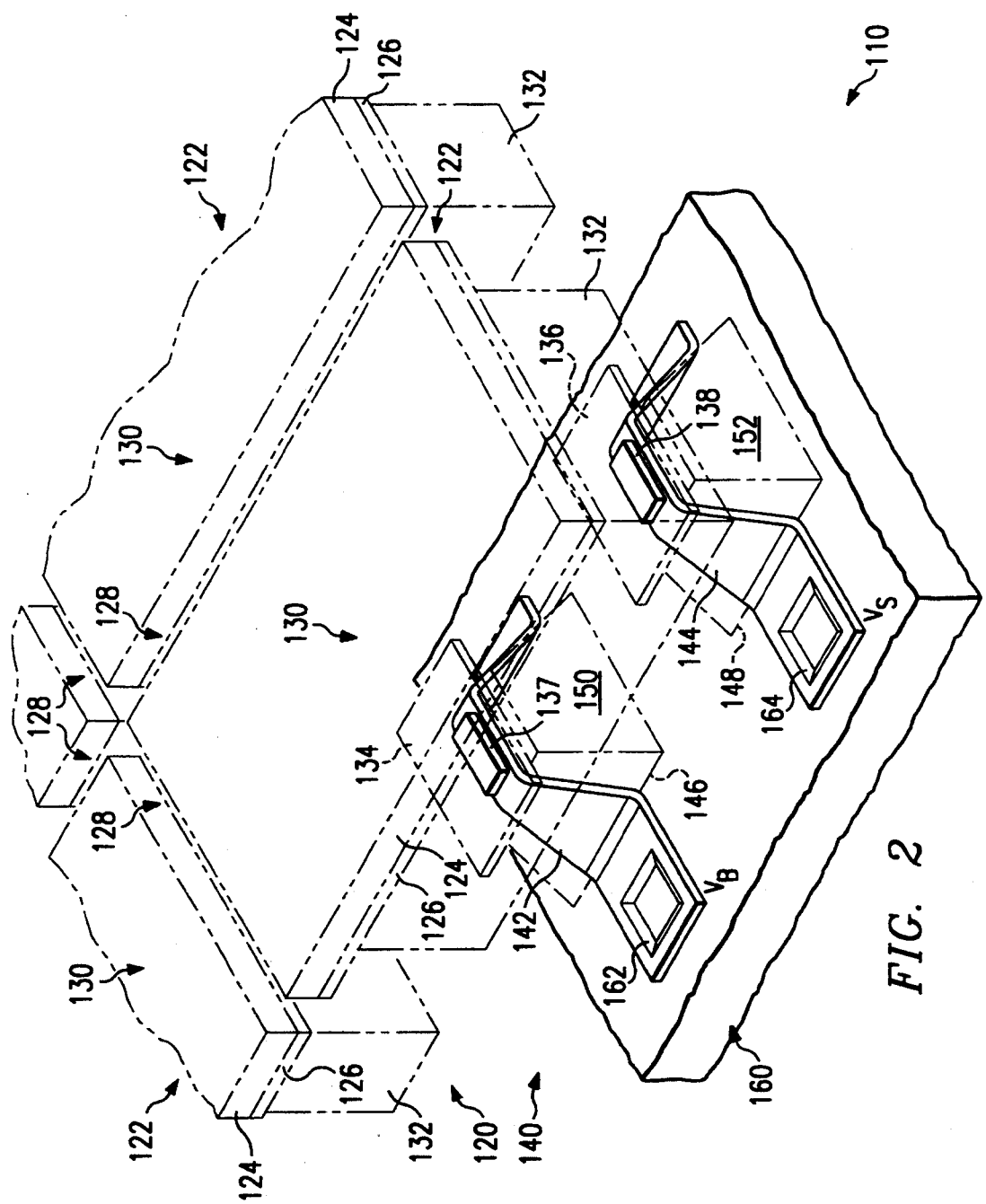
FIG. 2 is an isometric drawing with portions broken away showing a thermal isolation structure comprising a pair of bridge structures for thermally isolating and structurally supporting a thermal sensor, shown in shadow lines, and for electrically coupling the thermal sensor to associated contact pads on an integrated circuit substrate.
Figure 3:
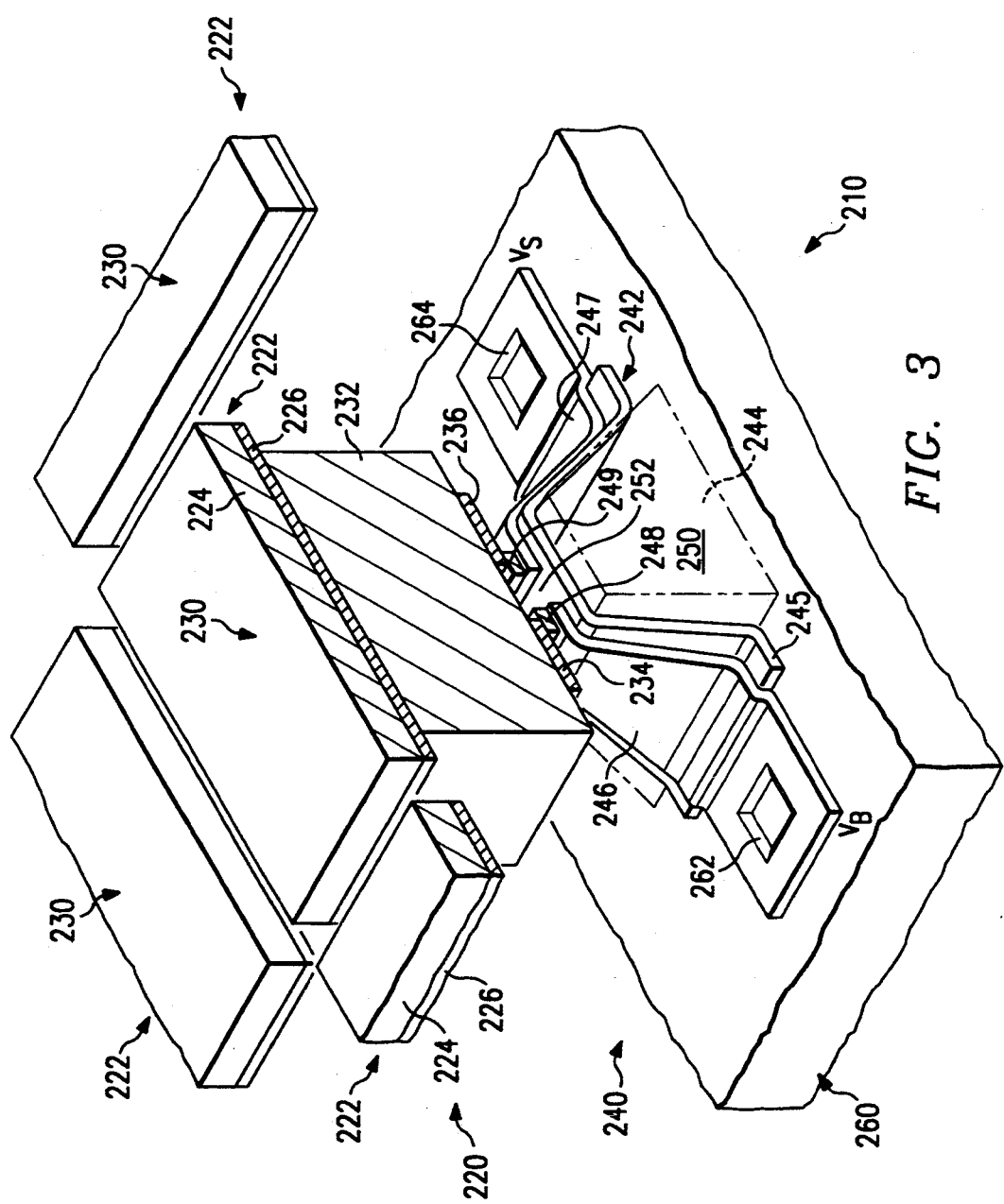
FIG. 3 is an isometric drawing with portions broken away showing a thermal isolation structure having an electrically non-conductive shell supporting a pair of leads formed from a low thermal conductivity film that electrically couple the thermal sensor to associated contact pads on an integrated circuit substrate.

The preferred embodiments of the present invention and its advantages are best understood by referring to FIGS. 1 through 3 of the drawings, like numerals being used for like and corresponding parts of the various drawings.

Infrared detectors are typically based upon either the generation of a change in voltage or current due to a change in temperature resulting from incident infrared radiation striking the detector or the generation of a change in voltage or current due to a photon-electron interaction within the material used to form the detector. This latter effect is sometimes called the internal photo-electric effect, and detectors using this phenomenon are called photon detectors. Detectors that make use of temperature dependent properties are called thermal detectors. Some thermal detectors are based upon the change in resistance or capacitance of a thin conductor caused by the heating effect of incident infrared radiation. Such thermal detectors are sometimes referred to as bolometers.

Thermal detection systems 10, 110, and 210, which will be described later and in more detail, function based upon the generation of a change in voltage or current due to a change in temperature of pyroelectric material resulting from incident infrared radiation. However, the present invention may be used with other types of thermal detectors including bolometers.

Some infrared detectors are hybrid solid state systems formed by mounting a focal plane array on an integrated circuit substrate with a thermal isolation structure disposed therebetween. A thermal isolation structure is particularly important for uncooled infrared detectors having a focal plane array mounted on an integrated circuit substrate. Typically, the thermal isolation structure includes one or more sensor signal flowpaths between the focal plane array and the associated integrated circuit substrate.

Some of the problems associated with previous thermal isolation structures include relatively high thermal conductivity associated with the electrical conductivity of the sensor signal flowpath between the focal plane array and the associated integrated circuit substrate. The present invention allows optimizing the strength of the thermal isolation structure required during bonding of the focal plane array with the integrated circuit substrate and maximizing the thermal isolation between the focal plane array and the integrated circuit substrate while at the same time providing adequate electrical conductivity for the associated sensor signal flowpath.

One embodiment of the present invention is shown in connection with the infrared detector or thermal detection system 10 shown in FIG. 1. Some of the principal components of thermal detection system 10 include focal plane array 20, thermal isolation structure 40, and integrated circuit substrate 60. Focal plane array 20 comprises a plurality of thermal sensors 30. The quantity and configuration of thermal sensors 30 depend on the desired N by M focal plane array. The various components of thermal detection system 10 are preferably contained in a housing (not shown) in a vacuum environment.

In general, thermal isolation structure 40 is used to provide mechanical support during bonding of focal plane array 20 with integrated circuit substrate 60. Thermal isolation structure 40 also thermally insulates focal plane array 20 from integrated circuit substrate 60 and provides a sensor signal interface between thermal sensors 30 and integrated circuit substrate 60. The sensor signal interface allows integrated circuit substrate 60 to process thermal images based on incident infrared radiation detected by thermal sensors 30 in focal plane array 20. Thermal isolation structure 40 of the present invention may be readily adaptable to any hybrid solid state system which will benefit from enhanced thermal isolation.

Various types of semiconductor materials and integrated circuit substrates may be used with the present invention. U.S. Pat. No. 4,143,269 entitled "*Ferroelectric Imaging System*," issued to McCormack, et. al. and assigned to Texas Instruments Incorporated, provides information concerning infrared detectors fabricated from pyroelectric materials and a silicon switching matrix or integrated circuit substrate. U.S. Pat. No. 5,047,644 entitled "*Polyimide Thermal Isolation Mesa For A Thermal Imaging System*," issued to Meissner, et. al. and assigned to Texas Instruments Incorporated, discloses a thermal isolation structure having thermal isolation mesa-type structures formed from polyimide.

Thermal detection system 10, as shown in FIG. 1 produces a thermal image in response to incident infrared radiation striking focal plane array 20. The principal components of focal plane array 20 include infrared absorber and common electrode assembly 22 coupled to a plurality of pyroelectric elements 32 to form a plurality of thermal sensors 30. For one application barium strontium titanate (BST) may be used to form pyroelectric elements 32. Also, materials in the lead titanate family including lead titanate (PT), lead lanthanum titanate (PLT), lead zirconium titanate (PZT), and lead lanthanum zirconium titanate (PZLT) may be used to form pyroelectric elements 32 for use with thermal detection systems incorporating the present invention.

Each thermal sensor 30 typically comprises pyroelectric element 32 and a corresponding section of infrared absorber and common electrode assembly 22 overlying pyroelectric element 32. Infrared absorber and common electrode assembly 22 further comprises infrared absorber layer 26 and reflective plate 28. Slots 24 are formed around the periphery of each thermal sensor 30 through both infrared absorber layer 26 and reflective plate 28. The slots are situated to minimize thermal crosstalk between adjacent thermal sensors 30, while still providing a common electrical connection to all thermal sensors in focal plane array 20 through infrared absorber and common electrode assembly 22.

Each thermal sensor 30 further comprises a sensor signal electrode 34 associated with each pyroelectric element 32. One side of each pyroelectric element 32 is attached to infrared absorber and common electrode assembly 22 of focal plane array 20. Each sensor signal electrode 34 is attached to the opposite side of an associated pyroelectric element 32.

Incident infrared radiation will produce a temperature change in pyroelectric element 32, which changes its electrical polarization and capacitance. The representative thermal image signal appearing on each sensor signal electrode 34 will depend upon the polarization and capacitance of the associated pyroelectric element 32, which in turn is a function of the incident infrared radiation. The thermal image signal from each thermal sensor 30 in focal plane array 20 passes to integrated circuit substrate 60 through respective bridge structure 42 provided by thermal isolation structure 40. Each thermal sensor 30 is preferably electrically coupled through bridge structure 42 to a corresponding contact pad 62 on integrated circuit substrate 60.

Bridge structure 42 shown in FIG. 1 may be formed over mesa-type formation 44, and contacts integrated circuit substrate 60 on opposite sides of mesa-type formation 44. In one embodiment, bridge structure 42 is formed from a single film or layer of low thermal conductivity material, such as a matrix of silicon monoxide and chromium. Mesa-type formation 44 may be formed from any appropriate material, including photosensitive or non-photosensitive polyimide.

An important feature of the embodiment includes forming bridge structure 42 from low thermal conductivity material which provides a high degree of thermal isolation between the associated focal plane array 20 and integrated circuit substrate 60. Bridge structure 42 may be formed from cermets, such as silicone monoxide and chromium, characterized by low thermal conductivity, high mechanical strength, and adequate electrical conductivity. The composition and percentages of metal and ceramics in the selected cermet may be varied to provide the optimum performance of the resulting thermal detection system 10. For some applications, ceramic material having a relatively high degree of electrical resistivity may be used to form bridge structure 42.

For one application of the present invention, bridge structure 42 may be formed by cermet having approximately eighty percent chromium and twenty percent silicon monoxide. Depending upon the specific application, bridge structure 42 may be formed from cermets having a metal concentration by weight of about seventy percent to ninety percent and a corresponding ceramic concentration by weight of about thirty percent to ten percent.

In addition to various cermets, bridge structure 42 may be formed from tantalum nitride, tantalum oxide and/or titanium oxide nitride. The present invention allows using a wide variety of low thermal conductivity materials to form bridge structure 42 with the desired optimum characteristics of low thermal conductivity, adequate electrical conductivity and high strength as required for the resulting thermal detection system.

Depending upon the type of low thermal conductivity material selected, bridge structure 42 may be formed on mesa-type formation 44 using reactive sputtering techniques or composite target sputtering. For one application of the present invention, sputtering with silicone and chromium in an oxygen environment may be used to form bridge structure 42 with the desired characteristics. Composite target sputtering allows compositional control to achieve the desired stoichiometry of the resulting bridge structure 42.

Bump-bonding metal 46 is formed on top of each bridge structure 42. Bump-bonding metal 46 is selected to be compatible with bump-bonding metal (not shown) on sensor signal electrode 34. Conventional bump-bonding procedures may be used to provide a good conductive bond between sensor signal electrode 34 of each thermal sensor element 30 and bridge structure 42, resulting in good sensor signal connections between each thermal sensor 30 and the associated contact pad 62. Indium bump-bonding techniques have been satisfactorily used to form metal bonds between focal plane array 20 and thermal isolation structure 40.

The configurations of mesa-type formation 44 and bridge structure 42 are design choices, largely dependent upon thermal isolation, structural rigidity, and signal flowpath considerations. Alternative configurations for mesa-type formation 44 include a formation with sloping sidewalls and a formation with vertical sidewalls. These configurations are exemplary only, and other configurations for both mesa-type formation 44 and bridge structure 42 will be apparent to those skilled in the art. In particular, while mesa-type formation 44 is shown as symmetrical in horizontal and vertical cross section, such symmetry is not required.

Mesa-type formation 44 may remain as part of thermal isolation structure 40 after bridge structure 42 is formed, or mesa-type formation 44 may be removed, as indicated by phantom lines in FIG. 1. If mesa-type formation 44 is removed, void space 50, partially defined by bridge structure 42, improves the thermal isolation of thermal isolation structure 40. In one embodiment, mesatype formation 44 may be removed after hybridization or bonding of focal plane array 20 to thermal isolation structure 40.

After mesa-type formation 44 is removed to create void space 50, bridge structure 42 provides the multiple functions of thermally isolating focal plane array 20 from integrated circuit substrate 60, structurally supporting focal plane array 20, and providing a sensor signal path from sensor signal electrode 34 to contact pad 62 on integrated circuit substrate 60. The functions of bridge structure 42 as supporting structure and signal transport medium are considered when designing thermal isolation structure 40 to achieve maximum thermal isolation between focal plane array 20 and integrated circuit substrate 60.

In one embodiment, bridge structure 42 is formed from a single film layer having both low thermal and electrical conductivity. As previously noted, various cermets may be used to form bridge structure 42. For one application, the cermet used to form bridge structure 42 will preferably have an electrical resistivity of 2,500 microhms-centimeter and a thermal conductivity of $1.1 \times 10^{-2}$ watts/centimeter/°C. A matrix of silicon monoxide and chromium is representative of the types of cermet which can provide these desired characteristics. By way of comparison, titanium tungsten which is often used to provide the sensor signal flowpath in previous hybrid thermal detection systems exhibits a thermal conductivity of 0.09 watts/centimeter/°C. Thus, the use of low thermal conductivity cermets may result in a substantial improvement in thermal isolation between focal plane array 20 and integrated circuit substrate 60. The formation of bridge structure 42 from a single film provides the advantages of easier fabrication and optimization of thermal isolation structure 40.

Previous systems have formed thermal isolation structures from an electrically non-conductive film supporting an extremely thin conductive film. This design technique demands extreme tolerances and tests design limits in the fabrication process. A two layer approach also presents difficulties in optimizing the design for maximum structural support, adequate electrical conductivity for signal transport, and maximum thermal isolation. The task of optimization of these three characteristics of thermal isolation structure 40 is substantially simplified by using a single, homogenous film of low thermal conductivity material. Furthermore, since bridge structure 42 is constructed of low thermal conductivity material, fabrication of a larger, thicker structure is possible, which improves structural integrity and simplifies the fabrication process.

The recommended design approach for forming bridge structure 42 from a single film or layer first specifies the minimum electrical conductivity requirements to transport a sensor signal from sensor signal electrode 34 through bridge structure 42 to contact pad 62. Since thermal conductivity and electrical conductivity are closely related, setting the minimum electrical conductivity of bridge structure 42 in turn specifies an approximate thermal isolation between focal plane array 20 and integrated circuit substrate 60 for a given material. Specifying the minimum electrical conductivity requirements also dictates the amount of low thermal conductivity material to be used in forming bridge structure 42. The final step in the recommended design approach maximizes structural support given generally the amount of low thermal conductivity material to be used. In addition to the above considerations, a design approach for bridge structure 42 may also consider contact pad geometry, bump-bonding requirements, sensor signal electrode 34 interface considerations, and limitations on surface area and height of thermal isolation structure 40, among other factors.

Design of thermal isolation structure 40, and in particular bridge structure 42, is typically a reiterative process during which the configuration of mesa-type formation 44, bridge structure 42, void space 50, contact pad 62, and bump-bonding metal 46 are varied to produce the desired structural integrity, sensor signal flowpath, and thermal isolation. Formation of void space 50 typically allows reduction of the overall thickness of thermal isolation structure 40 as compared to a thermal isolation structure having a solid mesa-type formation 44 without void space 50. Also, improved thermal isolation allows reducing the thickness of pyroelectric element 32, which reduces manufacturing costs.

Thermal isolation structure 40 is fabricated using conventional photolithographic techniques. Fabrication methods using photosensitive polyimide are described below. However, for some applications, non-photosensitive polyimide may be used. Fabrication using photosensitive polyimide is preferred, because it generally requires fewer process steps.

The first step in forming thermal isolation structure 40 is to apply the polyimide (photosensitive or non-photosensitive) to integrated circuit substrate 60 by spinning integrated circuit substrate 60 to flow the polyimide to uniform thickness. For the recommended fabrication using photosensitive polyimide, the polyimide is then exposed using a mask that patterns the polyimide layer. The exposed polyimide is developed using an appropriate solvent, and the unexposed polyimide is removed leaving the patterned array of polyimide mesa-type formations 44. Each mesa-type formation 44 is preferably formed adjacent to a respective contact pad 62 on integrated circuit substrate 60. The desired sidewall configuration may be determined by appropriate exposure and development techniques. The assembly is then cured in an appropriate heat-curing process to stabilize and harden the desired mesa-type formations 44. Mesa-type formations 44 may be formed from other suitable materials in addition to polyimide.

Using conventional photolithography techniques, a layer or film of low thermal conductivity material for bridge structure 42 may be placed over mesa-type formations 44. The low thermal conductivity material may be cermet, or any other suitable material. The desired characteristics of an appropriate material are low thermal conductivity, adequate electrical conductivity, high structural strength, and ease of use in the fabrication process. Portions of the low thermal conductivity layer are then removed using conventional organic etched chemistry to form bridge structure 42 having a typical thickness of 2,000 to 5,000 angstroms extending over at least a portion of each mesa-type formation 44. The thickness and geometry of bridge structure 42 depends on the low thermal conductivity material used and other design considerations described above. Bridge structure 42 couples to at least one contact pad 62 on integrated circuit substrate 60. As discussed above, bridge structure 42 provides the multiple functions of thermal isolation, structural support, and signal transport.

Additional fabrication steps may be employed to deposit bump-bonding metal 46 or electrically conductive epoxies (not shown) on the top of bridge structure 42 as desired. These additional fabrication steps are accomplished conventionally, with conventional materials selected for the specific application of thermal isolation structure 40.

Infrared absorber and common electrode assembly 22 is preferably formed with a plurality of openings or elongated slots 24 extending through both infrared absorber layer 26 and reflective plate 28. In addition to reducing thermal crosstalk between adjacent thermal sensors 30, openings 24 function as "etch access ports" to allow removal of mesa-type formations 44.

The precise structural configuration, and associated fabrication method, of mesa-type formation 44 and bridge structure 42 are significantly dependent upon the application chosen for the resulting thermal isolation structure 40. Even within a particular application, such as the exemplary thermal detection systems 10, 110, and 210, numerous design choices will be routinely implemented by those skilled in the art.

FIG. 2 illustrates an alternative embodiment of the present invention in which thermal detection system 110 comprises focal plane array 120, thermal isolation structure 140, and integrated circuit substrate 160. As previously noted for thermal detection system 10, the various components of thermal detection system 110 are preferably disposed in a vacuum environment.

Focal plane array 120 comprises a plurality of electrically isolated thermal sensors 130. Infrared absorber and common electrode assembly 22 of thermal detection system 10 has been replaced by a plurality of individual, discrete infrared absorber and reflective plate assemblies 122. Each infrared absorber and reflective plate assembly 122 is associated with a corresponding pyroelectric element 132. By forming focal plane array 120 with discrete infrared absorber and reflective plate assemblies 122, thermal conduction between adjacent thermal sensors 130 is significantly reduced, which reduces MTF losses associated with thermal detection system 110.

Thermal isolation structure 140 has been modified to provide two bridge structures 142 and 144 that electrically couple thermal sensor 130 to contact pads 162 and 164. Mesa-type formations 146 and 148, shown in phantom lines, are associated with bridge structures 142 and 144, respectively. As discussed above, mesa-type formations 146 and 148 may be removed during the fabrication process to create void spaces 150 and 152, respectively, for improved thermal isolation.

Each infrared absorber and reflective plate assembly 122 comprises infrared absorber layer 124 and reflective plate 126. A plurality of slots 128 are formed around the entire periphery of each infrared absorber and reflective plate assembly 122 to electrically and physically isolate each assembly 122 from adjacent assemblies 122. Since infrared absorber and reflective plate assemblies 122 are not connected with each other, bias voltage ($V_B$) cannot be applied to each pyroelectric element 132 through infrared absorber and common electrode assembly 22 as done in thermal detection system 10. Reflective plate 126 supports infrared absorber layer 124 and reflects incident infrared radiation to increase interaction with infrared absorber layer 124. Reflective plate 126 is not used to provide bias voltage ($V_B$) to the pyroelectric transducer represented by pyroelectric element 132.

The pyroelectric transducer or capacitor associated with each thermal sensor 130 is defined in part by pyroelectric element 132, bias voltage electrode 134, and sensor signal electrode 136. Bias voltage electrode 134 and sensor signal electrode 136 are disposed on the same side of pyroelectric element 132 but separated from each other. Therefore, pyroelectric element 132 functions as a dielectric with respect to electrodes 134 and 136.

Integrated circuit substrate 160 provides two contact pads 162 and 164. Bridge structures 142 and 144 electrically couple contact pads 162 and 164 to electrodes 134 and 136, respectively. Bridge structure 142 applies bias voltage ($V_B$) received from contact pad 162 to pyroelectric element 132 through bias voltage electrode 134. Bias voltage ($V_B$) may be a negative, positive, or zero potential. Bridge structure 144 transports signal voltage ($V_S$) received from pyroelectric element 132 through sensor signal electrode 136 to contact pad 164 in integrated circuit substrate 160.

Thermal isolation structure 140 of thermal detection system 110 is formed in a similar manner to thermal isolation structure 40 of thermal detection system 10. Two sets of bridge structures 142 and 144, contact pads 162 and 164, and electrodes 134 and 136 are provided to apply bias voltage to ($V_B$) and read signal voltage from ($V_S$) pyroelectric element 132. Focal plane array 120 may be joined to thermal isolation structure 140 using bump-bonding metal 137 and 138 located on bridge structures 142 and 144, respectively, and bump-bonding metal (not shown) on electrodes 134 and 136.

FIG. 3 illustrates an alternative embodiment of the present invention in which thermal detection system 210 comprises focal plane array 220, thermal isolation structure 240, and integrated circuit substrate 260. As previously noted for thermal detection systems 10 and 110, the various components of thermal detection system 210 preferably operate in a vacuum environment.

Focal plane array 220 comprises a plurality of individual, electrically isolated thermal sensors 230, each comprising infrared absorber and reflective plate assembly 222 coupled to pyroelectric element 232. Infrared absorber and reflective plate assembly 222 comprises infrared absorber layer 224 and reflective plate 226. Focal plane array 220 is similar in structure and function to focal plane array 120 of thermal detection system 110, shown in FIG. 2.

Thermal detection system 210 provides bias voltage ($V_B$) and senses signal voltage ($V_S$) using a two layer bridge structure 242 formed over mesa-type formation 244. Reinforcing layer 245 directly overlays mesa-type formation 244 and provides structural support to bridge structure 242. In one embodiment, reinforcing layer 245 is formed from silicon dioxide ($SiO_2$). A layer of low thermal conductivity material, such as cermet, is patterned over reinforcing layer 245 to form leads 246 and 247 coupled with contact pads 262 and 264, respectively. Lead 246 extends from contact pad 262 to partially covering the top section of reinforcing structure 245. In a similar fashion, lead 247 extends from contact pad 264 to partially covering the top of reinforcing structure 245. A gap 252 is provided between leads 246 and 247 to prevent electrical short circuiting between voltage levels at contact pads 262 and 264.

Disposed on top of leads 246 and 247 are bump-bonding metal 248 and 249, respectively. Bump-bonding metal 248 and 249 and corresponding bump-bonding metal (not shown) on bias voltage electrode 234 and sensor signal electrode 236 allow focal plane array 220 to be electrically and mechanically coupled to thermal isolation structure 240. In a similar manner to thermal detection system 110 shown in FIG. 2, a pyroelectric transducer or capacitor associated with each thermal sensor 230 is defined in part by pyroelectric element 232, bias voltage electrode 234, and sensor signal electrode 236.

Leads 246 and 247 are formed of low thermal conductivity material, and therefore provide structural support and adequate electrical conductivity without sacrificing thermal isolation. As with previous embodiments, mesa-type formation 244, formed from polyimide or other appropriate material, may be removed after bonding of focal plane array 220 to thermal isolation structure 240 to leave void space 250, which further improves thermal isolation.

Although the present invention has been described with several embodiments, various changes and modifications may be suggested to one skilled in the art, and it is intended that the present invention encompass such changes and modifications as fall within the scope of the appended claims.

What is claimed is:

1. A hybrid thermal detector comprising:
a plurality of thermal sensors for generating a sensor signal output representative of the thermal radiation incident to the respective thermal sensor, each thermal sensor having an associated pyroelectric element;
a substrate having a plurality of signal contact pads disposed on a substantially planar surface for receiving the sensor signal outputs from the respective thermal sensors;
a plurality of bridge structures disposed between the thermal sensors and the substrate, the bridge structures projecting from the substrate and formed from a single film of low thermal conductivity and adequate electrical conductivity material, each bridge structure having a corresponding signal contact pad; and
the thermal sensors being disposed over the substrate and supported by the bridge structures such that, for each thermal sensor, the sensor signal output is coupled through the respective bridge structure to the corresponding signal contact pad.

2. The detector of claim 1, wherein the bridge structures are formed from low thermal conductivity cermet having a metal concentration by weight of seventy percent to ninety percent and a corresponding ceramic concentration by weight of thirty percent to ten percent.

3. The detector of claim 1, wherein each bridge structure is formed over an associated mesa-type formation and contacts the integrated circuit substrate on opposite sides of the associated mesa-type formation.

4. The detector of claim 1, wherein the bridge structures are formed from a matrix of silicon monoxide and chromium.

5. The detector of claim 1, further comprising:
an infrared absorber and common electrode assembly having an infrared absorber layer sensitive to infrared radiation disposed on a reflective plate; and
each thermal sensor having its associated pyroelectric element formed from barium strontium titanate, the infrared absorber and common electrode assembly coupled with one side of the pyroelectric element and a sensor signal electrode bonded to at least one bridge structure and coupled with the opposite side of the pyroelectric element.

6. The detector of claim 1, wherein each thermal sensor further comprises:
an infrared absorber and reflective plate assembly having an infrared absorber layer sensitive to infrared radiation disposed on a reflective plate; and
the thermal sensor having its associated pyroelectric element formed from barium strontium titanate, the infrared absorber and reflective plate assembly coupled with one side of the pyroelectric element and a sensor signal electrode bonded to at least one bridge structure and coupled with the opposite side of the pyroelectric element.

7. The detector of claim 1, wherein each thermal sensor further comprises:
an infrared absorber and reflective plate assembly having an infrared absorber layer sensitive to infrared radiation disposed on a reflective plate;
the associated pyroelectric element formed from barium strontium titanate, the infrared absorber and reflective plate assembly coupled with one side of the pyroelectric element and a sensor signal electrode bonded to at least one bridge structure and coupled with the opposite side of the pyroelectric element;
a bias voltage electrode bonded to at least one bridge structure and coupled with the opposite side of the pyroelectric element spaced from the sensor signal electrode; and
the substrate further comprises a plurality of bias voltage contact pads, wherein voltage from a corresponding bias voltage contact pad is coupled to the bias voltage electrode through a corresponding bridge structure.

8. A hybrid thermal detector including a focal plane array mounted with a thermal isolation structure on an integrated circuit substrate, comprising:
a plurality of thermal sensors in the focal plane array for providing a sensor signal output representative of the thermal radiation incident to the focal plane array, each thermal sensor having an associated pyroelectric element;
a plurality of signal contact pads, disposed on the integrated circuit substrate, for receiving the sensor signal output from the respective thermal sensors;
the thermal isolation structure disposed between the focal plane array and the integrated circuit substrate, the thermal isolation structure formed in part by a plurality of bridge structures projecting from the integrated circuit substrate adjacent to the signal contact pads, the bridge structures formed from a single film of low thermal conductivity and adequate electrical conductivity material; and
wherein the bridge structures provide support for mounting the focal plane array with the thermal isolation structure on the integrated circuit substrate and provide a sensor signal flowpath to the signal contact pads.

9. The detector of claim 8, wherein each bridge structure is formed over an associated mesa-type formation and contacts the integrated circuit substrate on opposite sides of the associated mesa-type formation.

10. The detector of claim 8, wherein the bridge structures are formed from cermet having a thermal conductivity of less than $2 \times 10^{-2}$ watts/centimeter/°C.

11. The detector of claim 8, wherein the bridge structures partially define a void space associated with a mesa-type formation.

12. The detector of claim 8, wherein the focal plane array comprises an infrared absorber and common electrode assembly having an infrared absorber layer sensitive to infrared radiation disposed on a reflective plate, the infrared absorber and common electrode assembly coupled with one side of the pyroelectric element associated with each thermal sensor and a sensor signal electrode bonded to at least one bridge structure and coupled with the opposite side of the pyroelectric element.

13. The detector of claim 8, wherein each thermal sensor further comprises:
an infrared absorber and reflective plate assembly having an infrared absorber layer sensitive to infrared radiation disposed on a reflective plate, the infrared absorber and reflective plate assembly coupled with one side of the pyroelectric element associated with the thermal sensor and a sensor signal electrode bonded to at least one bridge structure and coupled with the opposite side of the pyroelectric element; and
a bias voltage electrode bonded with at least one bridge structure and coupled with the opposite side of the pyroelectric element spaced from the sensor signal electrode.

14. A method of fabricating a hybrid thermal detection system, comprising the steps of:
forming a focal plane array from a plurality of thermal sensors which provide a sensor signal output representative of thermal radiation incident to the focal plane array, each thermal sensor formed in part from an associated pyroelectric element;
providing an integrated circuit substrate with a plurality of signal contact pads for receiving the sensor signal output from the respective thermal sensors;
forming a plurality of mesa-type formations projecting from the integrated circuit substrate adjacent to the signal contact pads;
forming a plurality of bridge structures from a single film of low thermal conductivity and adequate electrical conductivity material, each bridge structure formed over an associated mesa-type formation and contacting the integrated circuit substrate on opposite sides of the associated mesa-type formation, each bridge structure electrically coupled to a corresponding contact pad; and
mounting the focal plane array with the bridge structures on the integrated circuit substrate.

15. The method of fabricating the system as defined in claim 14, wherein the bridge structures are formed in part by composite target sputtering.

16. The method of fabricating the system as defined in claim 14, wherein the mesa-type formations are formed in part with polyimide material and the bridge structures are formed from low thermal conductivity cermet having a metal concentration by weight of seventy percent to ninety percent and a corresponding ceramic concentration by weight of thirty percent to ten percent.

17. The method of fabricating the system as defined in claim 14, further comprising the step of removing substantially all of the mesa-type formations to form a void space under the bridge structures.

18. The method of fabricating the system as defined in claim 14, further comprising the step of placing bump-bonding material on a portion of each bridge structure for forming a sensor signal flowpath with a respective thermal sensor.

19. The method of fabricating the system as defined in claim 14, further comprising the steps of:
forming the focal plane array with an infrared absorber and common electrode assembly;
coupling one side of the pyroelectric element associated with each thermal sensor to the infrared absorber and common electrode assembly; and
coupling the opposite side of the respective pyroelectric element with at least one bridge structure, wherein the bridge structure provides a sensor signal flowpath to a corresponding signal contact pad.

20. The method of fabricating the system as defined in claim 14, further comprising the steps of:
forming the focal plane array with an infrared absorber and reflective plate assembly having an infrared absorber layer sensitive to infrared radiation disposed on a reflective plate;
coupling one side of the pyroelectric element associated with each thermal sensor with the respective infrared absorber and reflective plate assembly;
coupling the opposite side of the pyroelectric element with a sensor signal electrode bonded to at least one bridge structure; and
coupling the opposite side of the pyroelectric element spaced from the sensor signal electrode with a bias voltage electrode bonded to at least one bridge structure.

* * * * *